(12) United States Patent
Park et al.

(10) Patent No.: US 8,278,716 B2
(45) Date of Patent: Oct. 2, 2012

(54) METHOD OF FABRICATING POLYSILICON, THIN FILM TRANSISTOR, METHOD OF FABRICATING THE THIN FILM TRANSISTOR, AND ORGANIC LIGHT EMITTING DIODE DISPLAY DEVICE INCLUDING THE THIN FILM TRANSISTOR

(75) Inventors: Byoung-Keon Park, Yongin (KR); Dong-Hyun Lee, Yongin (KR); Kil-Won Lee, Yongin (KR); Tae-Hoon Yang, Yongin (KR); Jin-Wook Seo, Yongin (KR); Ki-Yong Lee, Yongin (KR); Ji-Su Ahn, Yongin (KR); Maxim Lisachenko, Yongin (KR)

(73) Assignee: Samsung Display Co., Ltd., Yongin (KR)

( * ) Notice: Subject to any disclaimer, the term of this patent is extended or adjusted under 35 U.S.C. 154(b) by 156 days.

(21) Appl. No.: 12/650,078

(22) Filed: Dec. 30, 2009
(Under 37 CFR 1.47)

(65) Prior Publication Data
US 2010/0163856 A1    Jul. 1, 2010

(30) Foreign Application Priority Data

Dec. 30, 2008    (KR) .................... 10-2008-0137239

(51) Int. Cl.
*H01L 23/62*    (2006.01)
*H01L 29/10*    (2006.01)
*H01L 21/20*    (2006.01)
*H01L 21/36*    (2006.01)
*H01L 29/76*    (2006.01)
*H01L 31/036*    (2006.01)
*H01L 31/112*    (2006.01)

(52) U.S. Cl. ......... 257/359; 257/E29.151; 257/E21.133; 257/66; 438/486

(58) Field of Classification Search .................... 257/40, 257/66, E21.412, E29.289, E33.053; 438/149
See application file for complete search history.

(56) References Cited

U.S. PATENT DOCUMENTS 5,824,574 A    10/1998    Yamazaki et al.
(Continued)

FOREIGN PATENT DOCUMENTS

CN    1396626    2/2003
(Continued)

OTHER PUBLICATIONS

A machine English translation of JP 08181325 A.*
(Continued)

*Primary Examiner* — Matthew Landau
*Assistant Examiner* — Khaja Ahmad
(74) *Attorney, Agent, or Firm* — H.C. Park & Associates, PLC

(57) ABSTRACT

A thin film transistor, a method of fabricating the thin film transistor, and an organic light emitting diode (OLED) display device including the thin film transistor, the thin film transistor including: a substrate; a buffer layer formed on the substrate; a first semiconductor layer disposed on the buffer layer; a second semiconductor layer disposed on the first semiconductor layer, which is larger than the first semiconductor layer; a gate electrode insulated from the first semiconductor layer and the second semiconductor layer; a gate insulating layer to insulate the gate electrode from the first semiconductor layer and the second semiconductor layer; source and drain electrodes insulated from the gate electrode and connected to the second semiconductor layer; an insulating layer disposed on the source and drain electrodes, and an organic light emitting diode connected to one of the source and drain electrodes.

22 Claims, 9 Drawing Sheets

U.S. PATENT DOCUMENTS

| | | | |
|---|---|---|---|
| 6,162,667 A | 12/2000 | Funai et al. | |
| 2003/0059990 A1 | 3/2003 | Yamazaki | |
| 2003/0094611 A1 | 5/2003 | Hayakawa | |
| 2003/0228723 A1 | 12/2003 | Yamazaki et al. | |
| 2006/0030085 A1 | 2/2006 | Park et al. | |
| 2006/0033106 A1 | 2/2006 | Seo et al. | |
| 2006/0051906 A1* | 3/2006 | Yamazaki | 438/149 |
| 2006/0270129 A1 | 11/2006 | Paik | |
| 2008/0296565 A1* | 12/2008 | Park et al. | 257/40 |

FOREIGN PATENT DOCUMENTS

| | | |
|---|---|---|
| CN | 101211985 | 7/2008 |
| JP | 8-181325 | 7/1996 |
| JP | 08181325 A * | 7/1996 |
| JP | 10-050609 | 2/1998 |
| JP | 10-106951 | 4/1998 |
| JP | 11-204435 | 7/1999 |
| JP | 2001-127301 | 5/2001 |
| KR | 10-2006-0017410 | 2/2006 |
| KR | 10-0742382 | 7/2007 |
| KR | 10-0770266 | 10/2007 |

OTHER PUBLICATIONS

A Self-aligned Bottom Gate Poly-Si TFT Technology; paper by Shengdong Zhang, Ruqi Han and Mansun Chan ; Issue Date : Sep. 11-13, 2001.*

European Search Report issued Apr. 12, 2010, in corresponding European Patent Application No. 09180961.6.

* cited by examiner

METHOD OF FABRICATING POLYSILICON, THIN FILM TRANSISTOR, METHOD OF FABRICATING THE THIN FILM TRANSISTOR, AND ORGANIC LIGHT EMITTING DIODE DISPLAY DEVICE INCLUDING THE THIN FILM TRANSISTOR

CROSS-REFERENCE TO RELATED APPLICATION

This application claims the benefit of Korean Patent Application No. 10-2008-0137239, filed Dec. 30, 2008, the disclosure of which is incorporated herein, by reference.

BACKGROUND OF THE INVENTION

1. Field of the Invention

Aspects of the present invention relate to a thin film transistor, a method of fabricating the thin film transistor, and an organic light emitting diode display device including the thin film transistor.

2. Description of the Related Art

In general, polysilicon can be applied to high field effect mobility circuits and high operating speed circuits. Polysilicon has the advantage of being applicable to CMOS circuit structures and is widely used in semiconductor layers of thin film transistors. Such a thin film transistor is often used as an active device in active matrix liquid crystal displays (AMLCDs) and as a switching device or driving device of organic light-emitting devices (OLEDs).

Methods of crystallizing amorphous silicon to form polysilicon include solid phase crystallization, excimer laser crystallization, metal induced crystallization, and metal induced lateral crystallization. Solid phase crystallization is a method of annealing amorphous silicon for a number of hours, at a maximum temperature of about 700° C., which is the melting temperature of a glass substrate of a display device including a thin film transistor. Excimer laser crystallization achieves crystallization by irradiating amorphous silicon with an excimer laser, to locally heat it to a high temperature, for a very short time. Metal induced crystallization induces a phase-change of an amorphous silicon layer into a polysilicon layer, by placing the amorphous silicon layer in contact with, or doping it with, a metal, such as nickel, palladium, gold or aluminum. Metal induced lateral crystallization involves inducing the sequential crystallization of an amorphous silicon layer, while a silicide formed by the reaction of metal and silicon expands laterally.

However, solid phase crystallization has the disadvantages of an excessively long processing time, as well as the tendency of a substrate to warp, due to the lengthy, high-temperature treatment. The excimer laser crystallization has the disadvantages of requiring an expensive laser and forming crystallized surface protrusions that degrade the characteristics of a semiconductor layer-gate insulating layer interface.

At present, methods employing a metal to crystallize an amorphous silicon layer are being extensively researched, because they have the advantages of being able to produce crystallization at a lower temperature and within a shorter time, as compared to solid phase crystallization. Crystallization methods employing a metal include metal induced crystallization (MIC), metal induced lateral crystallization (MILC), and super grain silicon (SGS) crystallization.

One important factor determining the characteristics of a thin film transistor is a leakage current. Especially in semiconductor layers crystallized using a metal catalyst, the metal catalyst may remain in a channel region and thereby increase the leakage current. Accordingly, if the concentration of metal catalyst remaining in the channel region is not controlled, the leakage current of the thin film transistor increases, and its electrical characteristics are degraded.

SUMMARY OF THE INVENTION

Aspects of the present invention provide a thin film transistor employing a semiconductor layer that is crystallized using metal catalyst, a method of fabricating the transistor, an organic light emitting diode (OLED) display device including the transistor, and a method of fabricating the OLED display device.

According to an aspect of the present invention, provided is a thin film transistor that includes: a substrate; a buffer layer disposed on the substrate; a first semiconductor layer and a second semiconductor layer disposed on the buffer layer; a gate electrode insulated from the first semiconductor layer and the second semiconductor layer; a gate insulating layer to insulate the gate electrode from the first semiconductor layer and the second semiconductor layer; and source and drain electrodes insulated from the gate electrode and connected to the second semiconductor layer. The first semiconductor layer is disposed below the second semiconductor layer, and is smaller than the second semiconductor layer.

According to another aspect to the present invention, provided is an OLED display device that includes a substrate; a buffer layer formed on the substrate; a first semiconductor layer disposed on the buffer layer; a second semiconductor layer disposed on the first semiconductor layer; a gate electrode insulated from the first semiconductor layer and the second semiconductor layer; a gate insulating layer to insulate the gate electrode from the first semiconductor layer and the second semiconductor layer; source and drain electrodes insulated from the gate electrode and connected to the second semiconductor layer; an insulating layer disposed on the source and drain electrodes; and a first electrode, an organic film layer, and a second electrode, disposed on the insulating layer and electrically connected to the source and drain electrodes. The first semiconductor layer is disposed below the second semiconductor layer, and is smaller than the second semiconductor layer.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the exemplary embodiments, taken in conjunction with the accompanying drawings, of which.

DETAILED DESCRIPTION OF THE EXEMPLARY EMBODIMENTS

Figure 1A:
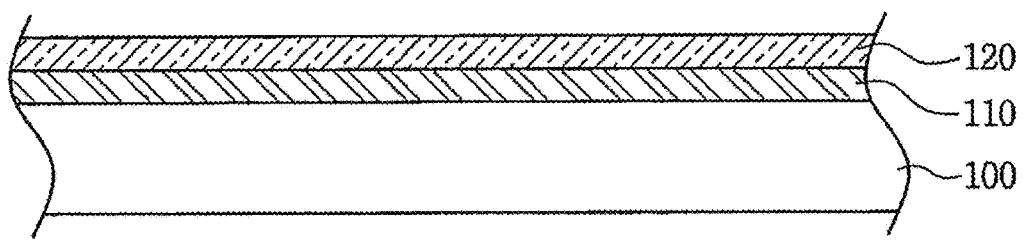
FIGS. 1A to 1F illustrate a method of fabricating a polysilicon layer, according to an exemplary embodiment of the present invention.

Reference will now be made in detail to the exemplary embodiments of the present invention, examples of which are illustrated in the accompanying drawings, wherein like reference numerals refer to the like elements throughout. The exemplary embodiments are described below, in order to explain the aspects of the present invention, by referring to the figures. When it is described that a first part is "connected" to a second part, the first and second parts can be directly electrically connected (no intervening elements) or can be indirectly electrically connected (intervening elements may be present). In the drawings, the lengths or thicknesses of layers and regions are exaggerated for clarity.

Herein, when a first element is referred to as being formed or disposed "on" a second element, the first element can be disposed directly on the second element, or one or more other elements may be disposed therebetween. When a first element is referred to as being formed or disposed "directly on" a second element, no other elements are disposed therebetween.

Figure 1B:
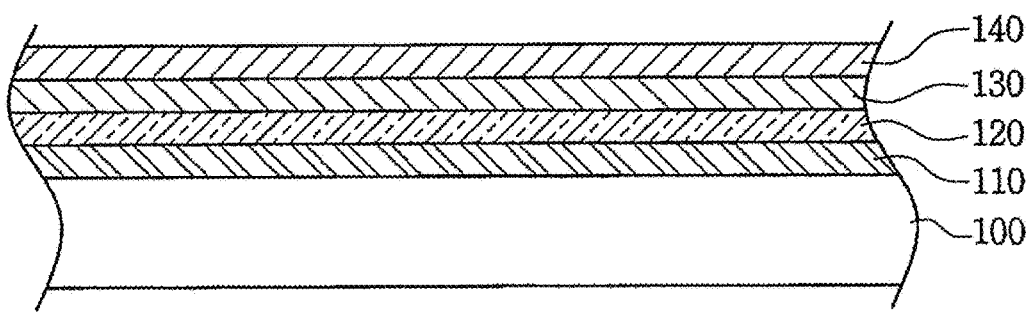
Figure 1C:
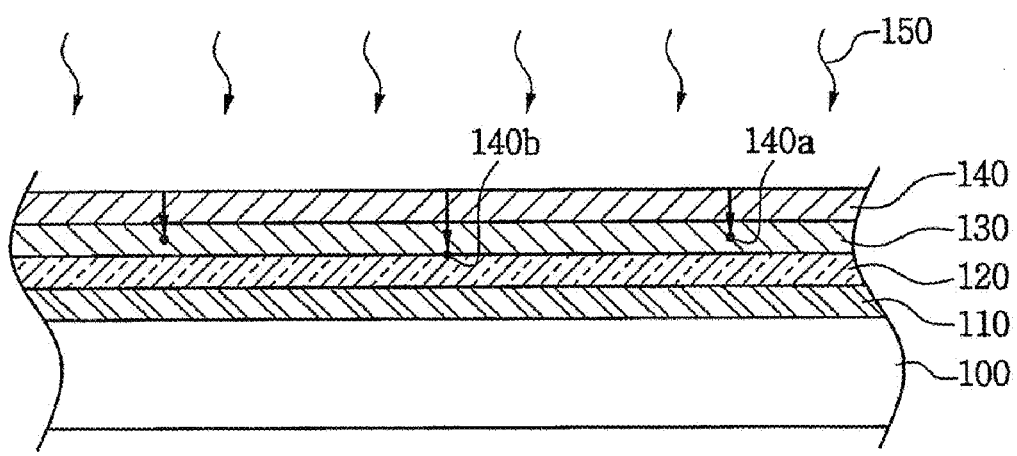
Figure 1D:
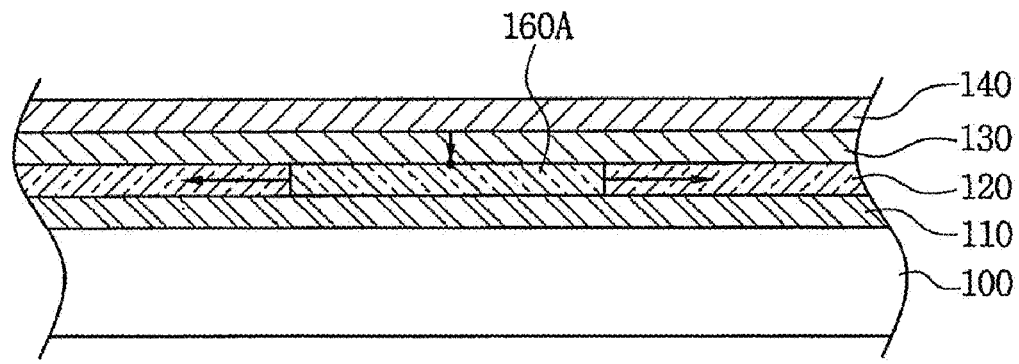
Figure 1E:
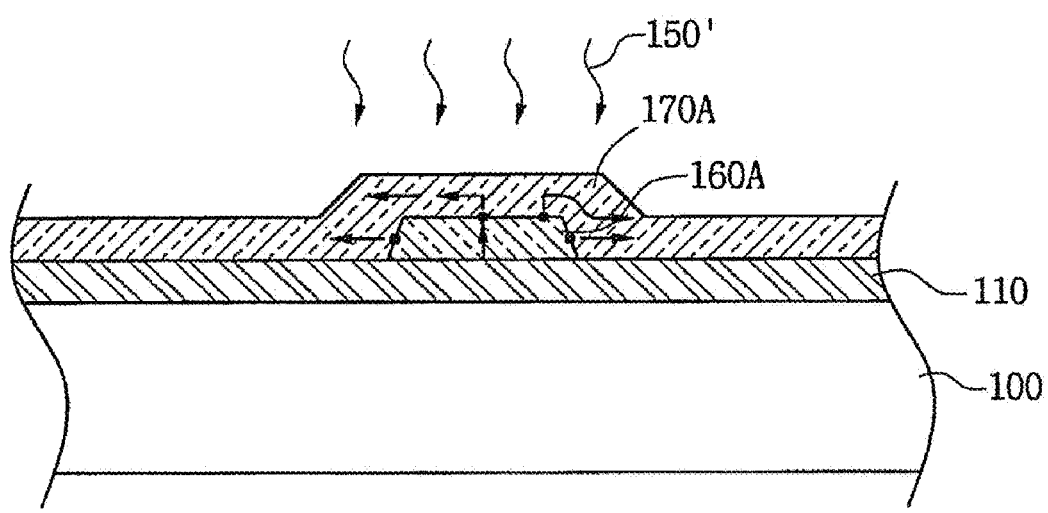
Figure 1F:
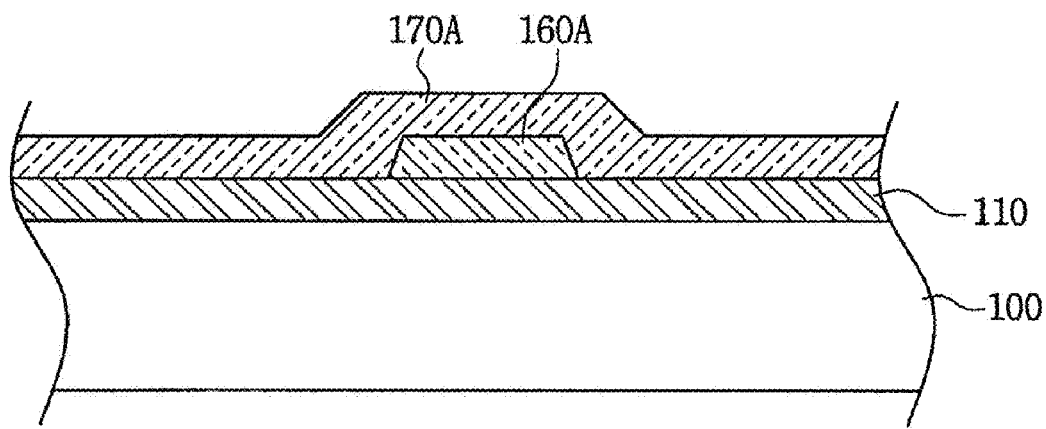

FIGS. 1A and 1E are cross-sectional views illustrating a crystallization process, according to a first exemplary embodiment of the present invention. Referring to FIG. 1A, a buffer layer 110 is formed on a substrate 100 made of a material, such as glass, or plastic. The buffer layer 110 can be formed as a single layer, using an insulating film, such as a silicon oxide film, or a silicon nitride film, using chemical vapor deposition or physical vapor deposition, or can be formed as a stacked structure of such films. The buffer layer 110 prevents the diffusion of moisture or impurities from the substrate 100 and controls the heat transfer rate during crystallization. Thus, the buffer layer 110 facilitates the crystallization of an amorphous silicon layer.

Subsequently, a first amorphous silicon layer 120 is formed on the buffer layer 110, using chemical vapor deposition or physical vapor deposition. When the first amorphous silicon layer 120 is formed, or after it is formed, a dehydrogenation process may be performed to reduce the concentration of hydrogen therein.

Next, the first amorphous silicon layer 120 is crystallized into a polysilicon layer, using a crystallization method employing metal catalyst, such as metal induced crystallization (MIC), metal induced lateral crystallization (MILC), or super grain silicon (SGS) crystallization. Here, a crystallized polysilicon layer region refers to a first metal catalyst crystallization region.

Below, exemplary embodiments of the present invention, in which SGS crystallization is used, will be described. SGS crystallization is a method that enables the size of crystal grains to be adjusted, in the range of from several to several hundreds of μm, by reducing the concentration of a metal catalyst that is diffused into the amorphous silicon layer. For example, a diffusion layer may be formed on the amorphous silicon layer, a metal catalyst layer may be formed on the diffusion layer, and then the metal catalyst may be diffused by annealing. According to the process, the concentration of metal catalyst diffusing into the amorphous silicon layer may be lowered by another method, such as by not forming the diffusion layer and forming the metal catalyst layer to a lower concentration.

Referring to FIG. 1B, a diffusion layer 130 is formed on the first amorphous silicon layer 120. The diffusion layer 130 may be formed of a silicon nitride film that enables the diffusion of a metal catalyst (formed in a subsequent process), via an annealing process. A composite silicon oxide and silicon nitride layer may be used as the diffusion layer 130. The diffusion layer 130 can be formed by a method such as chemical vapor deposition or physical vapor deposition. The thickness of the diffusion layer 130 is generally from 1 Å to 2000 Å. If the thickness of the diffusion layer 130 is less than 1 Å, the diffusion layer 130 may not sufficiently inhibit the diffusion of the metal catalyst, while if it is greater than 2000 Å, an insufficient amount of the metal catalyst may diffuse into the amorphous silicon layer 120.

Subsequently, the metal catalyst is deposited on the diffusion layer 130, to form a metal catalyst layer 140. The metal catalyst may be any one selected from the group consisting of Ni, Pd, Ag, Au, Al, Sn, Sb, Cu, Tr, and Cd. The metal catalyst layer 140 has a planar density of from $10^{11}$ to $10^{15}$ atoms/cm$^2$. When the planar density is less than $10^{11}$ atoms/cm$^2$, an insufficient number of seeds (crystallization nuclei) may be formed, and it may be difficult to crystallize the first amorphous silicon layer 120 into a polysilicon layer, by SGS crystallization. When the planar density is more than $10^{15}$ atoms/cm$^2$, too many seeds may be formed, resulting in a polysilicon layer having crystal grains that are too small. In addition, too much metal catalyst may remain, and a semiconductor layer formed by patterning the polysilicon layer may have poor characteristics.

FIG. 1C is a cross-sectional view of an annealing process performed on the substrate 100, to diffuse the metal catalyst through the diffusion layer 130, and transport it to the first amorphous silicon layer interface. Referring to FIG. 1C, the substrate 100, on which the buffer layer 110, the first amorphous silicon layer 120, the diffusion layer 130, and the metal catalyst layer 140 are formed, is subjected to an annealing process 150, to diffuse some of the metal catalyst in the metal catalyst layer 140 into the surface of the first amorphous silicon layer 120. That is, a small amount of metal catalyst 140b diffuses into the first amorphous silicon layer 120, while most of the metal catalyst 140a does not reach the amorphous silicon layer 120, or is unable to pass through the diffusion layer 130.

Accordingly, the amount of metal catalyst reaching the surface of the first amorphous silicon layer 120 is determined by the diffusion regulating ability of the diffusion layer 130, which is closely related to its thickness. That is, the thicker the diffusion layer 130, the smaller the amount of diffusion, and the larger the crystal grains, while the thinner the diffusion layer 130, the greater the amount of diffusion and the smaller the crystal grains.

Here, the annealing process 150 is performed for from several seconds to several hours, at a temperature of from about 200 to 900° C. and, and in particular, from about 350 to 500° C. Performing the annealing process 150 in this way can prevent the substrate 100 from warping, due to excessive annealing. The annealing process 150 may employ a furnace process, a rapid thermal annealing (RTA) process, a UV process, or a laser process, for example.

FIG. 1D is a cross-sectional view of a process of crystallizing the first amorphous silicon layer into a polysilicon layer, using the diffused metal catalyst 140b. Referring to FIG. 1D, the first amorphous silicon layer 120 is crystallized into a first metal catalyst crystallization region 160A, by the metal catalyst 140b. That is, the metal catalyst 140b combines with the silicon of the amorphous silicon layer, to form a metal silicide, the metal silicide forms seeds (crystallization nuclei) to crystallize the amorphous silicon layer into a polysilicon layer, and the first metal catalyst crystallization region 160A is formed. The first metal catalyst crystallization region 160A can be referred to as a first SGS crystallization region.

In FIG. 1D, the annealing process 150 is performed, without removing the diffusion layer 130 and the metal catalyst layer 140. However, after diffusing the metal catalyst into the surface of first amorphous silicon layer 120, to form the metal silicide (crystallization nuclei), the diffusion layer 130 and the metal catalyst layer 140 may be removed, before the annealing process is performed.

Referring to FIG. 1E, after a first metal catalyst crystallization region 160A (first SGS crystallization region) is patterned into an island shape, and a second amorphous silicon layer is formed on the entire surface of the substrate 100, an annealing process 150 is performed, in the same way as was performed on the first metal catalyst crystallization region 160A, to form a second metal catalyst crystallization region 170A.

The second amorphous silicon layer is crystallized by the annealing process, to form the second metal catalyst crystallization region 170A. The second metal catalyst crystallization region 170A is crystallized by residual metal catalyst 160a remaining in the first metal catalyst crystallization region 160A. The amount of the residual metal catalyst 160a is smaller in the second metal catalyst crystallization region 170A, than in the first metal catalyst crystallization region 160A. The second metal catalyst crystallization region 170A can be referred to as a second SGS crystallization region, which is crystallized by the diffusion of the residual metal catalyst 160a from the first SGS crystallization region.

The crystal grains of the second metal catalyst crystallization region 170A (the second SGS crystallization region) are about 3 to 4 times larger than the crystal grains of the first metal catalyst crystallization region 160A (the first SGS crystallization region). Also, if the surface of the second metal catalyst crystallization region 170A is etched and observed, seeds are not visible, and the crystal grain boundaries thereof are indistinct. This is because, while there are seeds on the surface of the first metal catalyst crystallization region 160a, the seeds of the second metal catalyst crystallization region are disposed at the bottom thereof, and form crystals that grow upward, and thus, the seeds are not visible on the surface. Therefore, fewer crystal grain boundaries are included in the second metal catalyst crystallization region 170A than in the first metal catalyst crystallization region, which provides for a lower barrier to charge mobility and superior electrical characteristics.

Figure 1G:
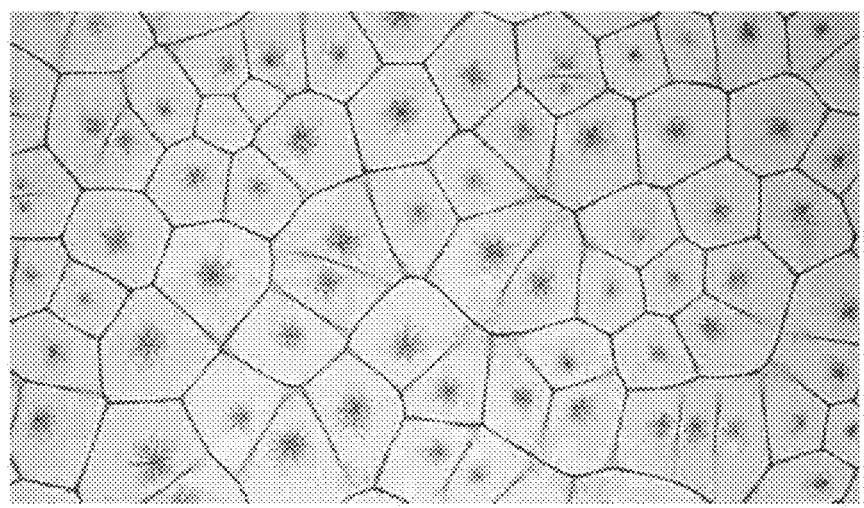
FIG. 1G is a micrograph of a first metal catalyst crystallization region, according to an exemplary embodiment of the present invention.
Figure 1H:
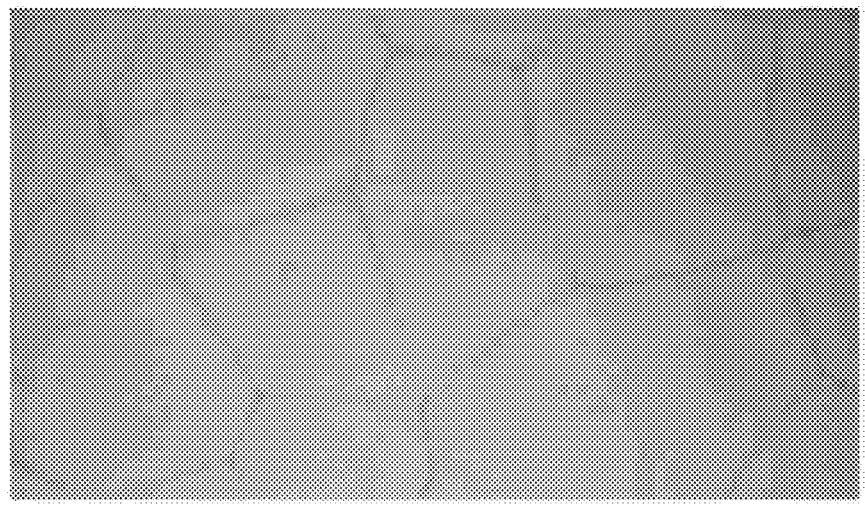
FIG. 1H is a micrograph of a second metal catalyst crystallization region, according to an exemplary embodiment of the present invention.

FIG. 1G is a micrograph of the surface of the first metal catalyst crystallization region 160A, and FIG. 1H is a micrograph of the surface of the second metal catalyst crystallization region 170A. Referring to FIGS. 1G and 1H, as described above, seeds can be seen inside of the crystal grains, and the grain boundaries are distinct on the surface of the first metal catalyst crystallization region of FIG. 1G. However, looking at the second metal catalyst crystallization region 170A, which is crystallized by the residual metal catalyst of the first metal catalyst crystallization region 160A, indistinct crystal grain boundaries and no seeds are seen. Since seeds are formed at the bottom of the second metal catalyst crystallization region 170A, which is where it contacts the first metal catalyst crystallization region 160A, and the crystallization proceeds upwards from there, seeds can be found in the bottom of the second metal catalyst crystallization region 170A, if the silicon layer is etched several times. Also, since the second metal catalyst crystallization region 170A is crystallized by the residual metal catalyst of the first metal catalyst crystallization region 160A, the amount of residual metal catalyst in the second metal catalyst crystallization region 170A is smaller than in the first metal catalyst crystallization region 160A. Based on these differences, the first metal catalyst crystallization region 160A can be distinguished from the second metal catalyst crystallization region 170A.

Figure 2A:
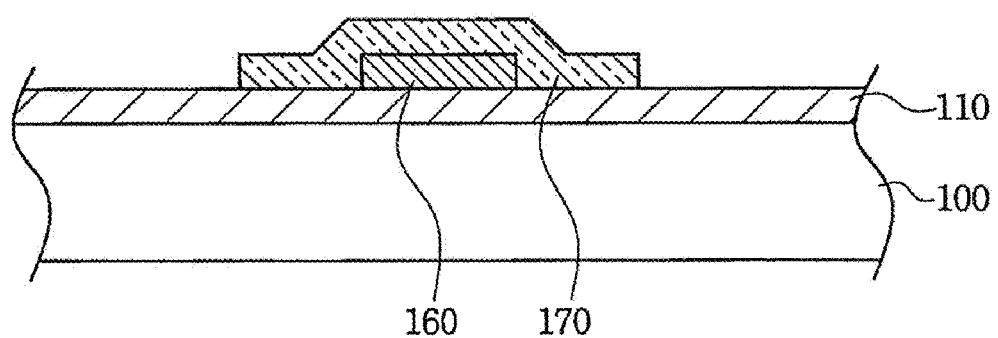
FIGS. 2A to 2C illustrate a top gate thin film transistor, according to an exemplary embodiment of the present invention.
Figure 2B:
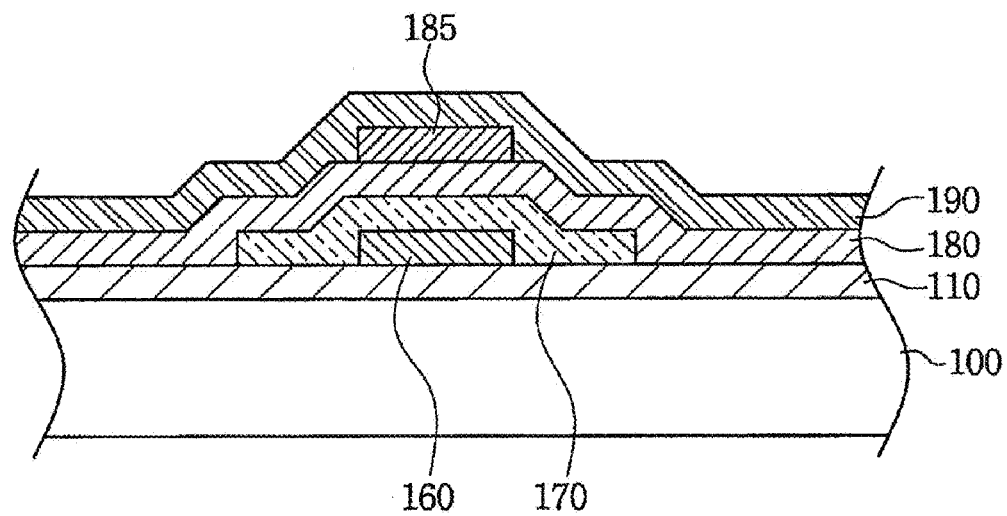
Figure 2C:
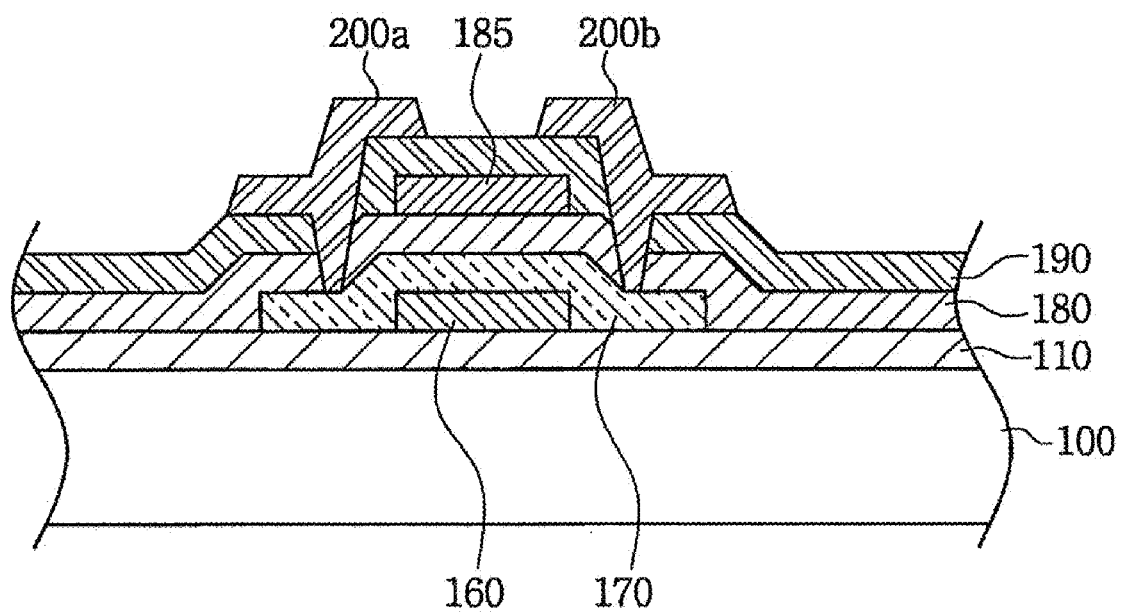

FIGS. 2A to 2C are cross-sectional views of processes of fabricating a top gate thin film transistor, using the method of fabricating a polysilicon layer, according to the first exemplary embodiment of the present invention. Referring to FIG. 2A, the substrate 100 including the first metal catalyst crystallization region 160A and the second metal catalyst crystallization region 170A, as shown in FIG. 1G, is prepared. Here, after the first metal catalyst crystallization region 160A is patterned into an island shape, to form a first semiconductor layer 160, the second metal catalyst crystallization region 170A is crystallized.

The second metal catalyst crystallization region 170A is patterned to form a second semiconductor layer 170. The second semiconductor layer 170 is larger (has a larger surface area) than the first semiconductor layer 160. The first semiconductor layer 160 may be disposed below a channel region of the second semiconductor layer 170. The first semiconductor layer 160 may be formed equal to, or smaller than, the channel region of the second semiconductor layer 170. When the first semiconductor layer 160 is smaller than the second semiconductor layer 170, it facilitates the diffusion of the metal catalyst remaining in the first semiconductor layer 160 into the second semiconductor layer 170. Thus, the crystallization is more effective than when the first semiconductor layer 160 has the same area as the second semiconductor layer 170.

The surface of the second semiconductor layer 170 that faces the first semiconductor layer 160 is not in direct contact with the metal catalyst, and thus, is clean and uniform. Further, since the diffusion of the metal catalyst from the first semiconductor layer 160 is uniformly performed, the crystal properties of the second semiconductor layer 170 are excellent, and the metal catalyst moves only towards the second semiconductor layer 170, and thus, a leakage current caused by metal contamination can be reduced. Here, the first semiconductor layer 160 can be referred to as a first SGS crystallization region, and the second semiconductor layer 170 can be referred to as a second SGS crystallization region.

Referring to FIG. 2B, a gate insulating layer 180 is formed over the second semiconductor layer 170 and the buffer layer 110. The gate insulating layer 180 may be a silicon oxide layer, a silicon nitride layer, or a dual silicon oxide/silicon nitride layer.

A metal layer (not shown) is formed on the gate insulating layer 180, as a single layer of aluminum (Al), or an aluminum alloy such as aluminum-neodymium (Al—Nd), or layers of the aluminum alloy on top of a chrome (Cr) or molybdenum (Mo) alloy. The metal layer is etched using a photolithography process, to form a gate electrode 185. The gate electrode 185 corresponds to a channel region of the second semiconductor layer 170.

Afterwards, an interlayer insulating layer 190 is formed over the gate electrode 185 and the gate insulating layer 180. The interlayer insulating layer 190 may be a silicon oxide layer, a silicon nitride layer, or a laminate thereof.

Referring to FIG. 2C, the interlayer insulating layer 190 and the gate insulating layer 180 are etched, to form contact holes exposing source/drain regions of the second semiconductor layer 170. Source/drain electrodes 200a and 200b are connected to the source/drain regions, through the contact holes. The source/drain electrodes 200a and 200b may be formed of any one selected from the group consisting of molybdenum (Mo), chrome (Cr), tungsten (W), molybdenum-tungsten (MoW), aluminum (Al), aluminum-neodymium (Al—Nd), titanium (Ti), titanium nitride (TiN), copper (Cu), a molybdenum alloy (Mo alloy), an aluminum alloy (Al alloy), and a copper alloy (Cu alloy). In this way, a thin film transistor, including the semiconductor layer 170, the gate electrode 185, and the source/drain electrodes 200a and 200b, is completed.

Table 1 compares characteristics of semiconductor layers formed of the second SGS crystallization region, according to an exemplary embodiment of the present invention and a conventional first SGS crystallization region.

| | Threshold Voltage (Vth) | Electron Mobility (cm$^2$/Vs) | S Factor (V/dec) | Off Current (A/µm) | Driving Voltage Range |
|---|---|---|---|---|---|
| Exemplary Embodiment | −1.82 | 59.74 | 0.48 | $3.20 \times 10^{-12}$ | −2.18 |
| Comparative Example | −2.52 | 51.44 | 0.58 | $6.02 \times 10^{-12}$ | −2.38 |

In the Exemplary Embodiment, the semiconductor layer was formed from the second SGS crystallization region, as described above, after forming the first metal catalyst crystallization layer using the metal catalyst, and then forming the second metal catalyst crystallization layer, by performing a second process of crystallization using the residual metal catalyst in the first metal catalyst crystallization region. In the comparative example, the semiconductor layer was formed from the first SGS crystallization region, after a first metal catalyst crystallization region was formed using an ordinary metal catalyst.

As shown in Table 1, the Exemplary Embodiment semiconductor layer had a lower threshold voltage, better electron mobility, and a smaller S factor than the Comparative Example semiconductor layer. Also, the Exemplary Embodiment second metal catalyst crystallization region had superior off current characteristics.

Figure 3A:
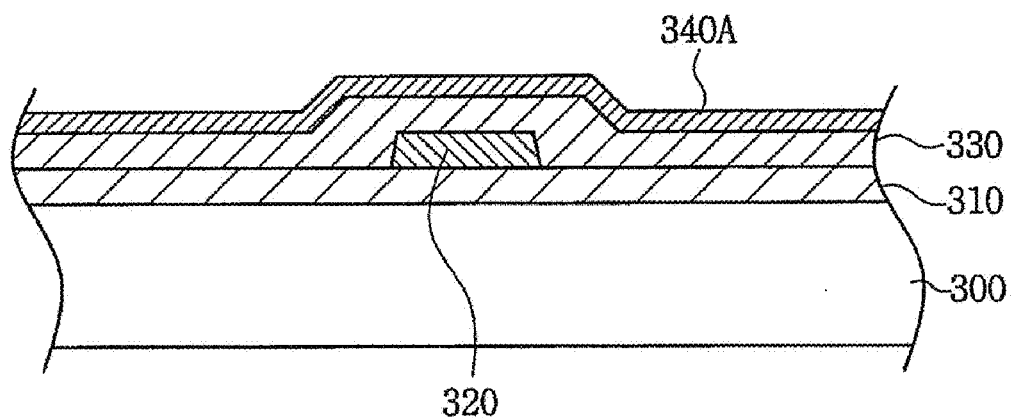
FIGS. 3A to 3D illustrate a bottom gate thin film transistor, according to an exemplary embodiment of the present invention.
Figure 3B:
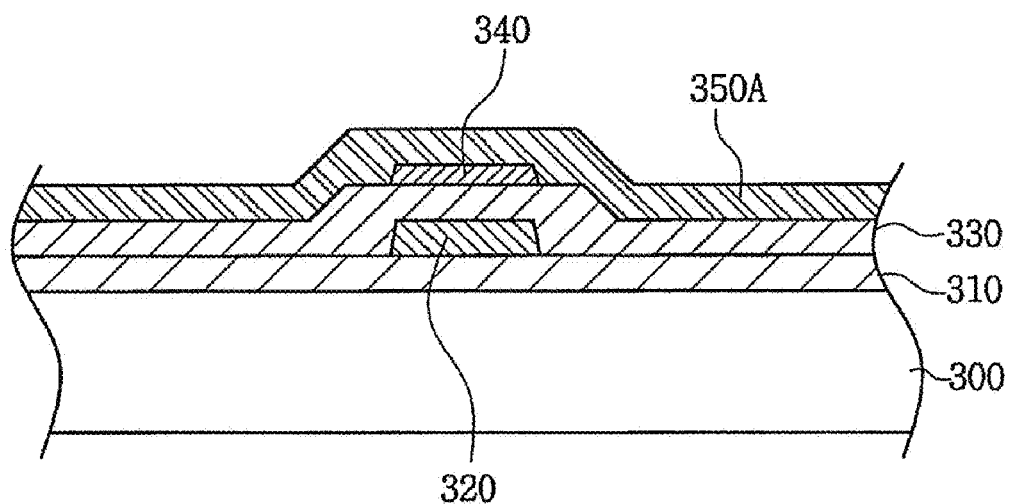
Figure 3C:
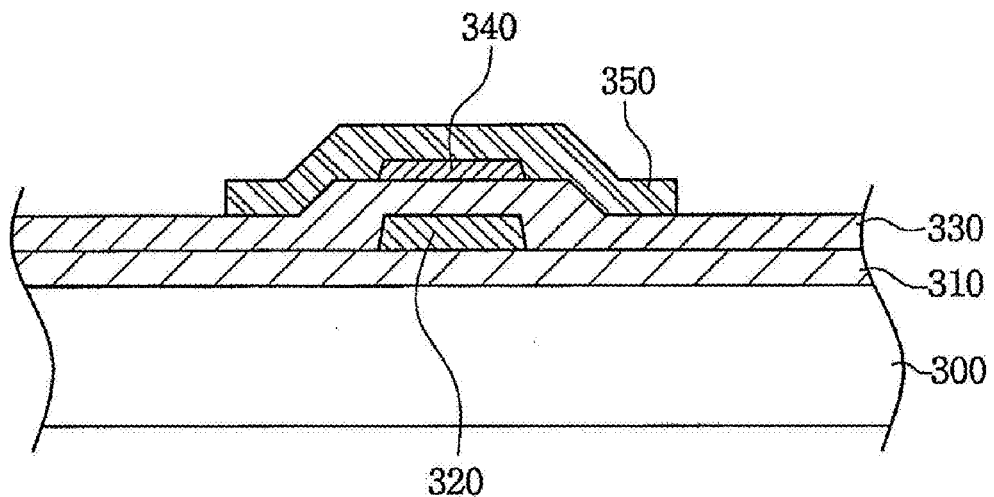

FIGS. 3A to 3C are cross-sectional views of processes of fabricating a bottom gate thin film transistor, using a method of fabricating a polysilicon layer, according to a second exemplary embodiment of the present invention. Referring to FIG. 3A, a buffer layer 310 is formed on a substrate 300. A metal layer (not shown) is formed on the buffer layer 310, and a gate electrode 320 is formed by etching the metal layer, using a photolithography process. Subsequently, a gate insulating layer 330 is formed on the gate electrode 320 and the buffer layer 310.

A first amorphous silicon layer is formed on the gate insulating layer 330. The first amorphous silicon layer is crystallized using a metal catalyst, as in the exemplary embodiment of FIGS. 1A-1F, to form a first metal catalyst crystallization region 340A (a first SGS crystallization region).

Referring to FIG. 3B, the first metal catalyst crystallization region 340A is patterned to form a first semiconductor layer 340, which corresponds to the gate electrode 320. A second amorphous silicon layer is formed on the first metal catalyst crystallization region 340 and is then crystallized by the diffusion of the residual metal catalyst from the first metal catalyst crystallization region 340A, according to the same method as in the first exemplary embodiment, to form a second metal catalyst crystallization region 350A.

Referring to FIG. 3C, the second metal catalyst crystallization region 350A is patterned to form a second semiconductor layer 350. The second semiconductor layer 350 has a larger surface area than the first semiconductor layer 340. The first semiconductor layer 340 is disposed below a channel region of the second semiconductor layer 350, and is the same size as, or is smaller than, the channel region of the second semiconductor layer 350. The first semiconductor layer 340 can be referred to as a first SGS crystallization region, and the second semiconductor layer 350 can be referred to as a second SGS crystallization region.

Figure 3D:
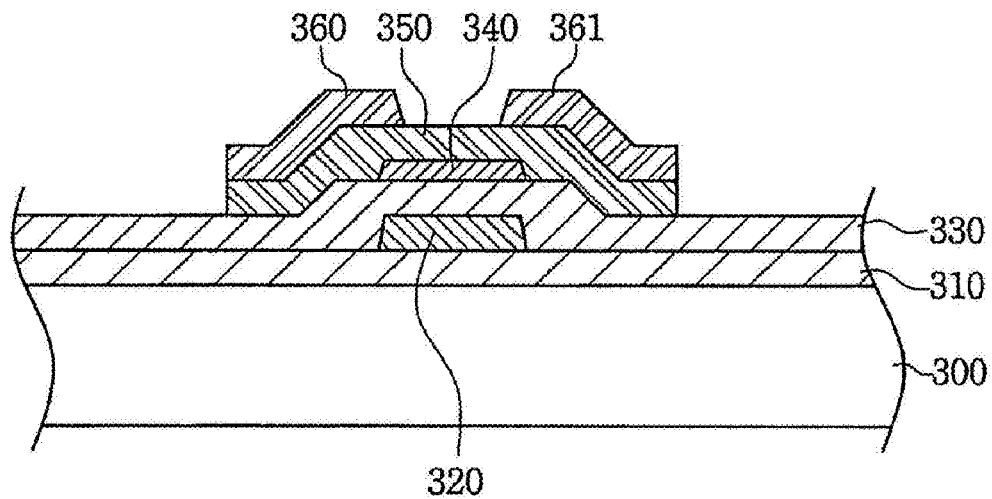

Referring to FIG. 3D, a source/drain conductive film is formed on the substrate 300 and patterned, to form source and drain electrodes 360 and 361. The source drain electrodes 360 and 361 may be formed of any one selected from the group consisting of molybdenum (Mo), chrome (Cr), tungsten (W), molybdenum-tungsten (MoW), aluminum (Al), aluminum-neodymium (Al—Nd), titanium (Ti), titanium nitride (TiN), copper (Cu), a molybdenum alloy (Mo alloy), an aluminum alloy (Al alloy), and a copper alloy (Cu alloy). In this way, a bottom gate thin film transistor, including the first semiconductor layer 340, the second semiconductor layer 350, the gate electrode 320, and the source/drain electrodes 360 and 361, is completed.

Figure 4:
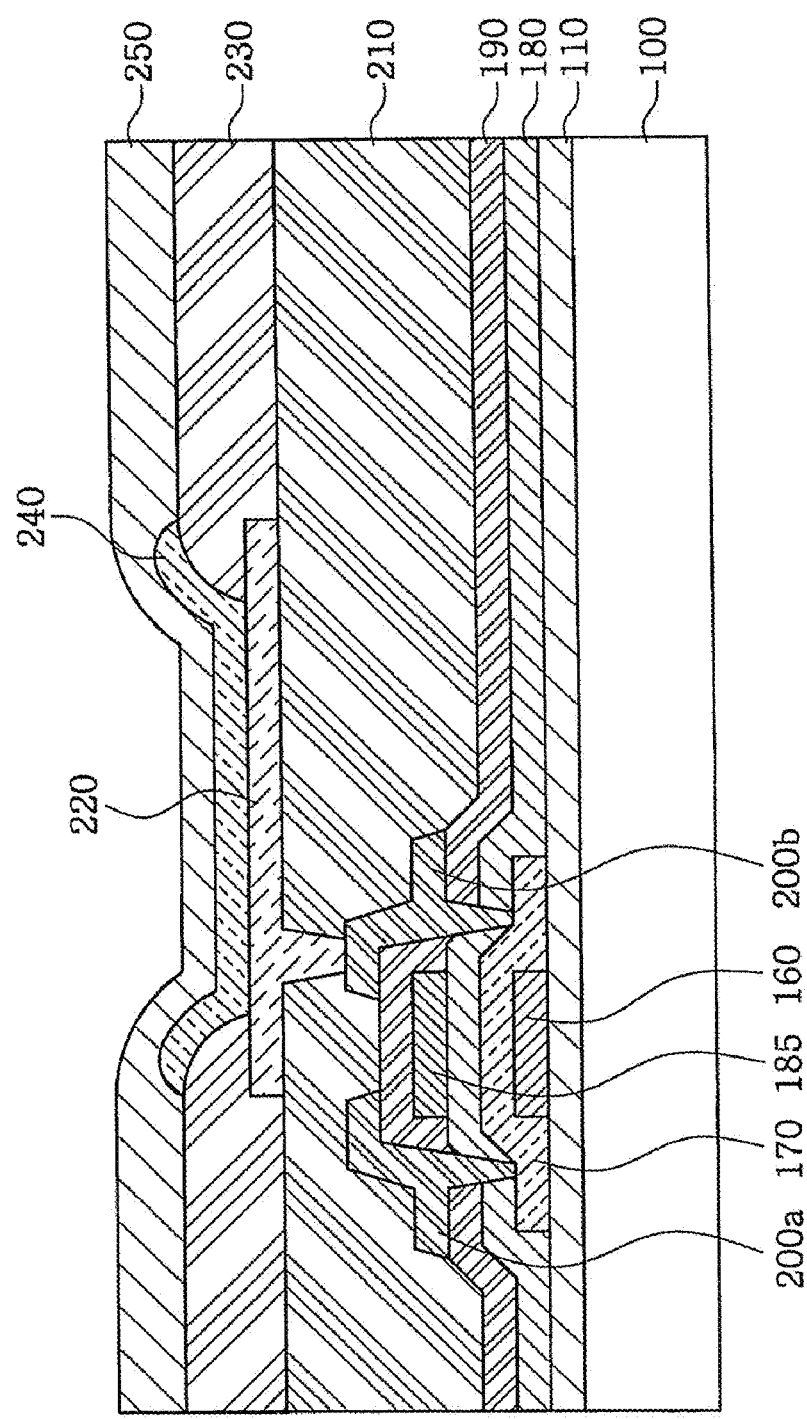
FIG. 4 illustrates an organic light emitting diode (OLED) display device, according to an exemplary embodiment of the present invention.

FIG. 4 is a cross-sectional view of an organic light emitting diode display device, including a top gate thin film transistor, formed using the first exemplary embodiment of the present invention. Referring to FIG. 4, an insulating layer 210 is formed on the entire surface of the substrate 100 including the thin film transistor shown in FIG. 2C. The insulating layer 210 may be an inorganic film that is formed of one selected from the group consisting of a silicon oxide film, a silicon nitride film, and an SOG film; or an organic film that is formed of one selected from the group consisting of a polyimide, a benzocyclobutene series resin, and an acrylate. Also, the insulating layer 210 may be a laminate of the inorganic film and the organic film.

The insulating layer 210 is etched to form a hole exposing one of the source/drain electrodes 200a and 200b. A first electrode 220 is connected to the one of the source and drain electrode 200a and 200b, through the hole. The first electrode 220 may be an anode or a cathode. When the first electrode 220 is an anode, it may be formed of a transparent conductive film selected from the group consisting of ITO, IZO and ITZO. When the first electrode 220 is a cathode, it may be formed of Mg, Ca, Al, Ag, Ba, or an alloy thereof.

A pixel defining layer 230, having an opening exposing the surface of the first electrode 220, is formed on the first electrode 220. An organic film layer 240, including a light-emitting layer, is formed on the exposed first electrode 220. On the organic film layer 240, a hole injection layer, a hole transport layer, a hole suppression layer, an electron suppression layer, an electron injection layer, and/or an electron transport layer may be formed. Next, the second electrode 250 is formed on the organic film layer 240. In this way, an organic light emitting diode (OLED) display device, according to an exemplary embodiment of the present invention, is completed.

Accordingly, the semiconductor layer of the exemplary thin film transistor has superior properties to a semiconductor layer formed by a conventional SGS crystallization process, and thus, is highly effective when used in a display.

Aspects of the present invention provide a thin film transistor including a semiconductor layer crystallized using metal catalyst, a method of fabricating the transistor, and an organic light emitting diode (OLED) display device including the transistor. Aspects of the present invention also provide a method of forming a superior semiconductor layer having larger crystal grains and a smaller amount of remaining metal catalyst, than a conventional semiconductor layer crystallized using a metal catalyst. Aspects of the present invention also provide a thin film transistor having an improved threshold voltage and Ioff characteristics, a method of fabricating the transistor, and an OLED display device including the transistor.

Although a few exemplary embodiments of the present invention have been shown and described, it would be appreciated by those skilled in the art that changes may be made in these exemplary embodiments, without departing from the principles and spirit of the invention, the scope of which is defined in the claims and their equivalents.

What is claimed is:

1. A thin film transistor comprising:
   a substrate;
   a buffer layer disposed on the substrate;
   a first semiconductor layer comprising a lowermost surface disposed on the substrate, the first semiconductor layer further comprising an uppermost surface opposite the lowermost surface, a first side surface, and a second side surface;
   a second semiconductor layer disposed directly on the uppermost surface, the first side surface, and the second side surface of the first semiconductor layer, the second semiconductor layer having a larger surface area than the first semiconductor layer;
   a gate electrode disposed on the substrate;
   a gate insulating layer disposed on the substrate, between the gate electrode and the first and second semiconductor layers; and
   source and drain electrodes connected to the second semiconductor layer, the source and drain electrodes being insulated from the gate electrode,
   wherein a channel region of the second semiconductor layer is disposed on the entire uppermost surface of the first semiconductor layer.

2. The thin film transistor of claim 1, wherein the first semiconductor layer and the second semiconductor layer are polysilicon layers formed using a metal catalyst.

3. The thin film transistor of claim 1, wherein the first semiconductor layer and the second semiconductor layer are crystallized by super grain silicon (SGS) crystallization.

4. The thin film transistor of claim 1, wherein the crystal grains of the second semiconductor layer are larger than the crystal grains of the first semiconductor layer.

5. The thin film transistor of claim 1, wherein:
   the buffer layer is disposed directly on the substrate;
   the first semiconductor layer is disposed directly on the buffer layer;
   the second semiconductor layer is disposed directly on the first semiconductor layer and the buffer layer;
   the gate insulating layer is disposed directly on the second semiconductor layer and the buffer layer; and
   a gate electrode is disposed directly on the gate insulating layer, facing the first and second semiconductor layers.

6. The thin film transistor of claim 1, wherein:
   the buffer layer is disposed directly on the substrate;
   the gate electrode is disposed directly on the buffer layer;
   the gate insulating layer is disposed directly on the gate electrode and the buffer layer;
   the first semiconductor layer is disposed directly on the gate insulating layer, facing the gate electrode;
   the second semiconductor layer is disposed directly on the first semiconductor layer and the gate insulating layer; and
   the source and drain electrodes are disposed directly on the second semiconductor layer.

7. A method of fabricating a thin film transistor, comprising:
   forming a buffer layer on a substrate;
   forming a lowermost surface of a first semiconductor layer on the buffer layer, the first semiconductor layer further comprising an uppermost surface opposite the lowermost surface, a first side surface, and a second side surface;
   forming a second semiconductor layer directly on the uppermost surface, the first side surface, and the second side surface of the first semiconductor layer, the second semiconductor layer having a larger surface area than the first semiconductor layer;
   forming a gate insulating layer on the second semiconductor layer;
   forming a gate electrode on the gate insulating layer; and
   forming source and drain electrodes on the gate insulating layer, the source and drain electrodes being connected to the second semiconductor layer,
   wherein the second semiconductor layer is a polysilicon layer that is crystallized by a metal catalyst contained in the first semiconductor layer,
   wherein a channel region of the second semiconductor layer is disposed on the entire uppermost surface of the first semiconductor layer.

8. The method of claim 7, wherein the forming of the first and second semiconductor layers comprises:
   forming a first amorphous silicon layer on the buffer layer;
   forming a metal catalyst layer on the first amorphous silicon layer;
   annealing the first amorphous silicon layer to form a first metal catalyst crystallization region;
   removing the metal catalyst layer;
   patterning the first metal catalyst crystallization region to form the first semiconductor layer;
   forming a second amorphous silicon layer on the first semiconductor layer;
   annealing the second amorphous silicon layer to form a second metal catalyst crystallization region; and
   patterning the second metal catalyst crystallization region to form the second semiconductor layer.

9. The method of claim 8, wherein crystallizing the first amorphous silicon layer is performed after a diffusion layer is formed between the first amorphous silicon layer and the metal catalyst layer.

10. The method of claim 8, wherein the annealings are performed at a temperature of from about 350° C. to 500° C.

11. The method of claim 8, wherein the metal catalyst layer is formed of one selected from the group consisting of Ni, Pd, Ag, Au, Al, Sn, Sb, Cu, Tr, and Cd.

12. A method of forming a thin film transistor, comprising:
   forming a buffer layer on a substrate;
   forming a gate electrode on the buffer layer;
   forming a gate insulating layer on the gate electrode and the buffer layer;
   forming a lowermost surface of a first semiconductor layer on the gate insulating layer, the first semiconductor layer facing the gate electrode and comprising an uppermost surface opposite the lowermost surface, a first side surface, and a second side surface;
   forming a second semiconductor layer directly on the uppermost surface, the first side surface, and the second side surface of the first semiconductor layer, the second semiconductor layer having a larger surface area than the first semiconductor layer; and forming source and drain electrodes on opposing sides of the second semiconductor layer, the source and drain electrodes being connected to the second semiconductor layer, wherein the second semiconductor layer is a polysilicon layer crystallized by a metal catalyst contained in the first semiconductor layer, wherein a channel region of the second semiconductor layer is disposed on the entire uppermost surface of the first semiconductor layer.

13. The method of claim 12, wherein the forming of the first and second semiconductor layers comprises:

forming a first amorphous silicon layer on the gate insulating layer;

forming a metal catalyst layer on the first amorphous silicon layer;

annealing the first amorphous silicon layer to form a first metal catalyst crystallization region;

removing the metal catalyst layer;

patterning the first metal catalyst crystallization region to form the first semiconductor layer;

forming a second amorphous silicon layer on the first semiconductor layer;

annealing the second amorphous silicon layer to form a second metal catalyst crystallization region; and patterning the second metal catalyst crystallization region to form the second semiconductor layer.

14. The method of claim 13, further comprising forming a diffusion layer between the first amorphous silicon layer and the metal catalyst layer, prior to the annealing of the first amorphous silicon layer.

15. The method of claim 13, wherein the annealings are performed at a temperature of from about 350° C. to 500° C.

16. The method of claim 14, wherein the metal catalyst layer is formed of any one selected from the group consisting of Ni, Pd, Ag, Au, Al, Sn, Sb, Cu, Tr, and Cd.

17. An organic light emitting diode (OLED) display device comprising:

the thin film transistor of claim 1;

an insulating layer disposed on the source and drain electrodes;

a first electrode disposed on the insulating layer and electrically connected to one of the source and drain electrodes;

an organic film layer disposed on the first electrode; and a second electrode disposed on the organic film layer.

18. The device of claim 17, wherein the first semiconductor layer and the second semiconductor layer are polysilicon layers formed using a metal catalyst.

19. The device of claim 17, wherein the first semiconductor layer and the second semiconductor layer are crystallized by super grain silicon (SGS) crystallization.

20. The device of claim 17, wherein the crystal grains of the second semiconductor layer are larger than the crystal grains of the first semiconductor layer.

21. An organic light emitting diode (OLED) display device comprising:

the thin film transistor of claim 5;

an insulating layer disposed on the source and drain electrodes;

a first electrode disposed on the insulating layer and electrically connected to one of the source and drain electrodes;

an organic film layer disposed on the first electrode; and a second electrode disposed on the organic film layer.

22. An organic light emitting diode (OLED) display device comprising:

the thin film transistor of claim 6;

an insulating layer disposed on the source and drain electrodes;

a first electrode disposed on the insulating layer and electrically connected to one of the source and drain electrodes;

an organic film layer disposed on the first electrode; and a second electrode disposed on the organic film layer.

* * * * *